(12) United States Patent
DeKock et al.

(10) Patent No.: US 10,162,920 B1
(45) Date of Patent: Dec. 25, 2018

(54) SYSTEM AND METHOD FOR PERFORMING OUT OF ORDER NAME RESOLUTION IN AN ELECTRONIC DESIGN

(71) Applicant: Cadence Design Systems, Inc., San Jose, CA (US)

(72) Inventors: Jonathan Lee DeKock, Carlisle, MA (US); Steven G. Esposito, Westford, MA (US); Manu Chopra, New Delhi (IN); Meir Ovadia, Petah Tikva (IL)

(73) Assignee: Cadence Design Systems, Inc., San Jose, CA (US)

( * ) Notice: Subject to any disclaimer, the term of this patent is extended or adjusted under 35 U.S.C. 154(b) by 29 days.

(21) Appl. No.: 15/294,168

(22) Filed: Oct. 14, 2016

(51) Int. Cl.
*G06F 17/50* (2006.01)
*G06F 17/30* (2006.01)

(52) U.S. Cl.
CPC .... *G06F 17/5045* (2013.01); *G06F 17/30345* (2013.01)

(58) Field of Classification Search
USPC ........................................................ 716/102
See application file for complete search history.

(56) References Cited

U.S. PATENT DOCUMENTS

2009/0158225 A1\* 6/2009 Basappa ............. G06F 17/5045
716/106

\* cited by examiner

*Primary Examiner* — Bryce M Aisaka
(74) *Attorney, Agent, or Firm* — Mark H. Whittenberger, Esq.; Holland & Knight LLP

(57) ABSTRACT

The present disclosure relates to systems and methods for performing out of order name resolution in an electronic design language. Embodiments may include receiving, one or more design units associated with an electronic design and registering the one or more design units in a registry database. Embodiments may further include performing local name resolution for each element reference within at least one of the one or more design units. In response to registering, embodiments include identifying at least one element reference upon which local name resolution was not performed and obtaining an appropriate element reference from the registry database. Embodiments may further include reviewing at least one secondary design unit for one or more local declarations and performing local name resolution for one or more remaining element references using a design hierarchy.

20 Claims, 3 Drawing Sheets

SYSTEM AND METHOD FOR PERFORMING OUT OF ORDER NAME RESOLUTION IN AN ELECTRONIC DESIGN

FIELD OF THE INVENTION

The present disclosure relates to electronic designs and, more particularly, for performing out of order name resolution in an electronic design language.

DISCUSSION OF THE RELATED ART

Name resolution is a critical element of processing an electronic design language (e.g., hardware description languages "HDLs", which may include but are not limited to SystemVerilog, Verilog, VHDL, C, C++, and other hardware description languages known in the art). SystemVerilog, for example, contains a rich set of hierarchical references to various language constructs (e.g., packages, classes, class objects, module instances, functions, methods, etc.). Additionally, the resolution of these hierarchical references follow a well-defined algorithm. Name resolution must be accurate and fast. Moreover, SystemVerilog often requires that elements be defined before referenced as opposed to providing an out-of-order name resolution capability.

SUMMARY

In one or more embodiments of the present disclosure, a computer-implemented method for performing out of order name resolution in an electronic design language is provided. The method may include receiving, one or more design units associated with an electronic design and registering the one or more design units in a registry database. The method may further include performing local name resolution for each element reference within at least one of the one or more design units. In response to registering, the method include identifying at least one element reference upon which local name resolution was not performed and obtaining an appropriate element reference from the registry database. The method may further include reviewing at least one secondary design unit for one or more local declarations and performing local name resolution for one or more remaining element references using a design hierarchy.

One or more of the following features may be included. The method may further include generating the one or more design units, wherein each of the one or more design units is configured as a sub-tree entry in an abstract syntax tree. In some embodiments, the element reference may be at least one of a package, a class, a class object, a module instance, a function, and a method. The method may further include receiving incoming source code associated with the electronic design and parsing the incoming source code to generate an abstract syntax tree ("AST"). In some embodiments, performing local name resolution for each element reference may include reading the abstract syntax tree. The method may further include producing at least one construct in a resolved syntax tree ("RST") based upon, at least in part, the reading of the abstract syntax tree. The at least one construct may be one or more of a non-reference element and a reference element.

In another embodiment of the present disclosure a computer-readable storage medium having stored thereon instructions that when executed by a machine result in a number of operations is provided. Some operations may include receiving, one or more design units associated with an electronic design and registering the one or more design units in a registry database. Operations may further include performing local name resolution for each element reference within at least one of the one or more design units. In response to registering, operations include identifying at least one element reference upon which local name resolution was not performed and obtaining an appropriate element reference from the registry database. Operations may further include reviewing at least one secondary design unit for one or more local declarations and performing local name resolution for one or more remaining element references using a design hierarchy.

One or more of the following features may be included. Operations may further include generating the one or more design units, wherein each of the one or more design units is configured as a sub-tree entry in an abstract syntax tree. In some embodiments, the element reference may be at least one of a package, a class, a class object, a module instance, a function, and a method. Operations may further include receiving incoming source code associated with the electronic design and parsing the incoming source code to generate an abstract syntax tree ("AST"). In some embodiments, performing local name resolution for each element reference may include reading the abstract syntax tree. Operations may further include producing at least one construct in a resolved syntax tree ("RST") based upon, at least in part, the reading of the abstract syntax tree. The at least one construct may be one or more of a non-reference element and a reference element.

In yet another embodiment of the present disclosure a system for performing out of order name resolution in an electronic design language is provided. The system may include a computing device having at least one processor configured to receive, one or more design units associated with an electronic design and to register the one or more design units in a registry database. The at least one processor may be further configured to perform local name resolution for each element reference within at least one of the one or more design units. In response to registering, the at least one processor may be further configured to identify at least one element reference upon which local name resolution was not performed and to obtain an appropriate element reference from the registry database. The at least one processor may be further configured to review at least one secondary design unit for one or more local declarations and perform local name resolution for one or more remaining element references using a design hierarchy.

One or more of the following features may be included. The at least one processor may be further configured to generate the one or more design units, wherein each of the one or more design units is configured as a sub-tree entry in an abstract syntax tree. In some embodiments, the element reference may be at least one of a package, a class, a class object, a module instance, a function, and a method. The at least one processor may be further configured to receive incoming source code associated with the electronic design and parse the incoming source code to generate an abstract syntax tree ("AST"). In some embodiments, performing local name resolution for each element reference may include reading the abstract syntax tree. The at least one processor may be further configured to produce at least one construct in a resolved syntax tree ("RST") based upon, at least in part, the reading of the abstract syntax tree.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
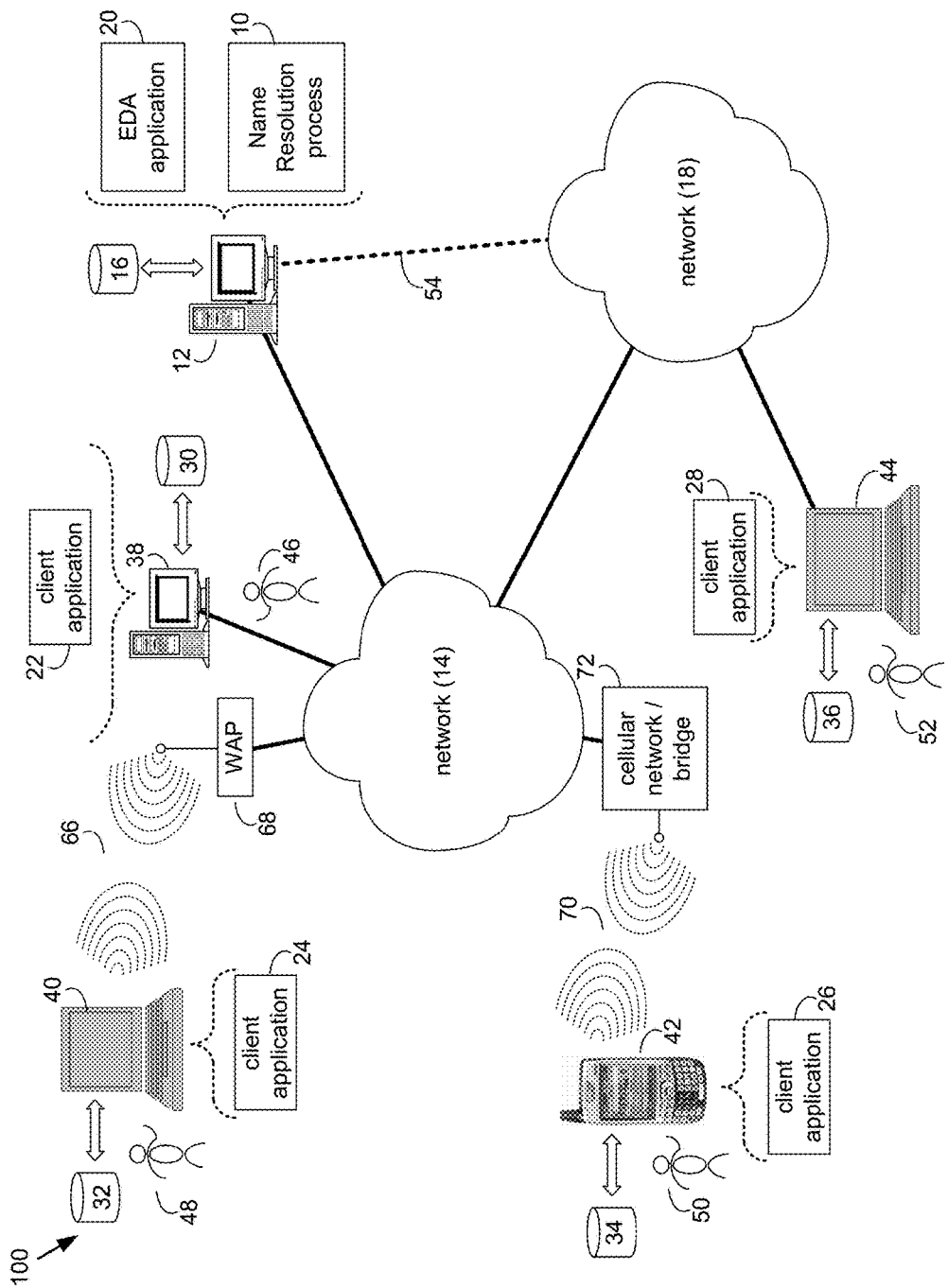
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown name resolution process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the name resolution process 10 may reside on and be executed, in whole or in part, by a client electronic device, such as a personal computer, notebook computer, personal digital assistant, or the like.

The instruction sets and subroutines of name resolution process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20). EDA application 20 may interact with one or more EDA client applications (e.g., EDA client applications 22, 24, 26, 28) for electronic circuit design.

In some embodiments, name resolution process 10 may be a stand-alone application, or may be an applet/application/script that may interact with and/or be executed within EDA application 20. In addition/as an alternative to being a server-side process, the name resolution process 10 may be a client-side process (not shown) that may reside on a client electronic device (described below) and may interact with an EDA client application (e.g., one or more of EDA client applications 22, 24, 26, 28). Further, the name resolution process 10 may be a hybrid server-side/client-side process that may interact with EDA application 20 and an EDA client application (e.g., one or more of client applications 22, 24, 26, 28). As such, the name resolution process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize name resolution process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
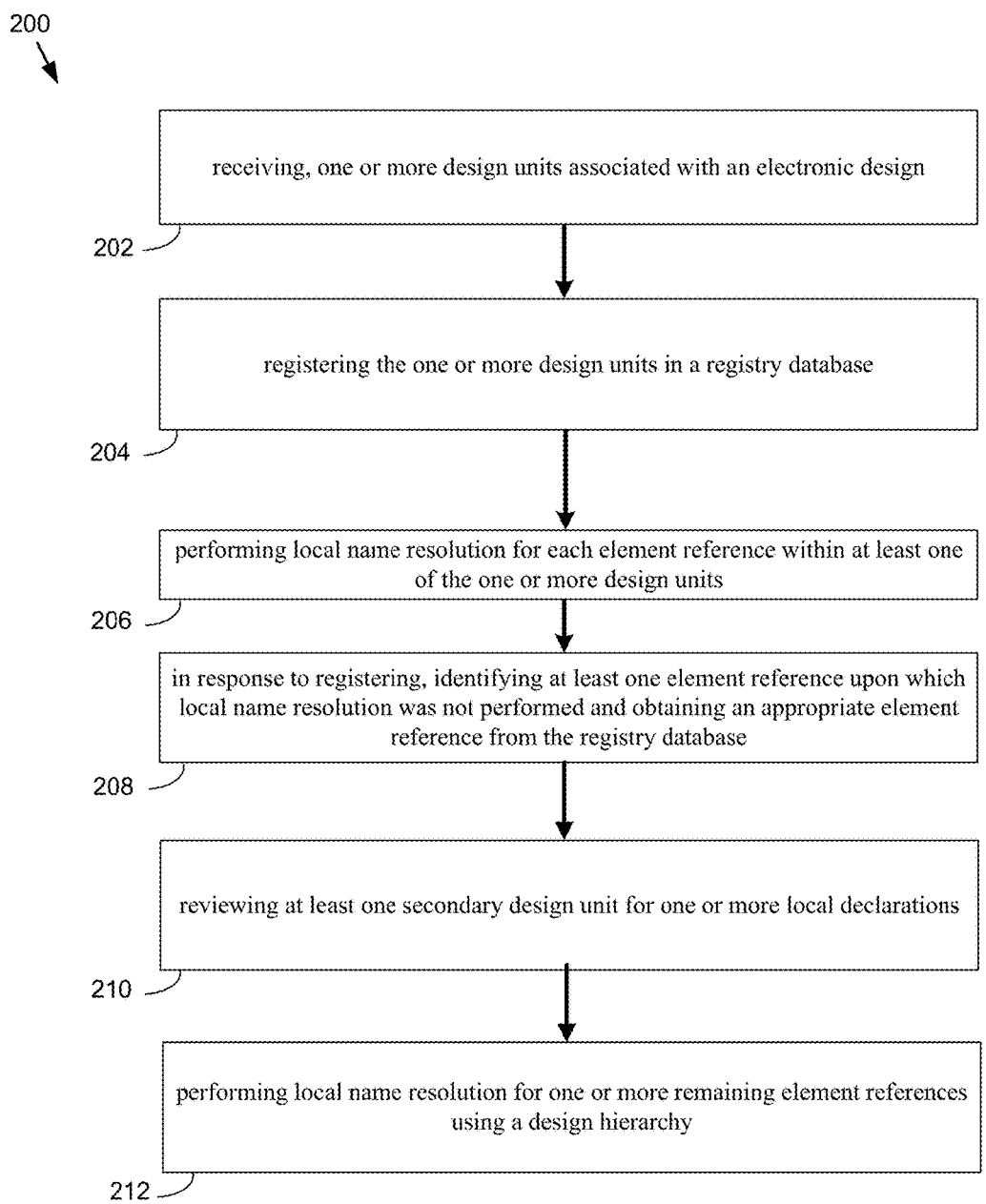
FIG. 2 is a flowchart depicting a name resolution process in accordance with an embodiment of the present disclosure.

Referring also to FIG. 2, in some embodiments and as will be discussed below in greater detail, name resolution process 200 may include receiving (202), one or more design units associated with an electronic design and registering (204) the one or more design units in a registry database. Embodiments may further include performing (206) local name resolution for each element reference within at least one of the one or more design units. In response to registering, embodiments include identifying (208) at least one element reference upon which local name resolution was not performed and obtaining an appropriate element reference from the registry database. Embodiments may further include reviewing (210) at least one secondary design unit for one or more local declarations and performing (212) local name resolution for one or more remaining element references using a design hierarchy.

Embodiments of the name resolution process 10 described herein may provide a parallel method for out-of-order name resolution in a hardware description language such as SystemVerilog. It should be noted that any specific references to the SystemVerilog language included herein are provided merely by way of example as any suitable language may be used in accordance with the teachings included herein.

As discussed above, name resolution is a critical element of processing an electronic design language. SystemVerilog, for example, contains a rich set of hierarchical references to various language constructs (e.g., packages, classes, class objects, module instances, functions, methods, etc.). Additionally, the resolution of these hierarchical references follow a well-defined algorithm. Name resolution must be accurate and fast. Moreover, SystemVerilog often requires that elements be defined before referenced as opposed to providing an out-of-order name resolution capability.

Accordingly, embodiments of name resolution process 10 described herein may be configured to provide a parallel method for fast, out-of-order name resolution. Embodiments included herein may rely upon a number of core tenets. Some of these may include but are not limited to, multiple data models, a parallel phase oriented system, and a definitive resolution technique. Each of these concepts are discussed in further detail hereinbelow.

In some embodiments, two distinct data models may be used when performing name resolution. Namely, an abstract syntax tree ("AST") and a resolved syntax tree ("RST"). The AST may be the result of parsing the incoming SystemVerilog source code. The AST only represents syntax including the relationship between syntactic elements. The AST does not include other information (such as generated artifacts), nor does the act of creating the AST perform any additional actions such as semantic checking (i.e., beyond construction semantics, e.g., there cannot be two registers of the same name in the same scope), or name resolution.

In some embodiments, the RST may still be a syntax tree representation, but it may be used to perform name resolution. As such, it may include additional data elements that help in name resolution. Each of these data models may be employed for very focused actions. For example, parsing for the AST, and name resolution for the RST. The separation of parsing and name resolution is a primary factor for enabling out-of-order name resolution. In this way, liberating name resolution from parsing means all declaration elements may be present in a particular scope when the name resolution occurs. Additionally, this split may enable a high degree of parallelism when performing name resolution. The parallelism follows when sets of element declarations are known to be available.

Embodiments of name resolution process 10 may provide a parallel, phase oriented system. Accordingly, the fast, parallel out-of-order name resolution approach described herein may break processing into a series of phases. As used herein, the term "phase" may refer to a grouping of data-parallel tasks. That is, each task within the phase may perform the same code (e.g., methods and functions) or different data sets. In this way, phases may be ordered. They may have relationships with other phases. These relationships can be data oriented or process oriented. A data oriented relationship exists between two phases P1 and P2 when P1 sends data to P2 for additional processing.

In some embodiments, data oriented phase relationships may be represented as: P1→P2. There are three fundamental process oriented phase relationships possible, namely, sequential, overlapping, and independent. Two phases have a sequential relationship when all processing in one phase must complete before any processing may begin in another. The phases have an overlapping relationship when processing in one phase may occur after processing in another has started. This is not the same as simultaneous—the two phases do not process completely at the same time. Rather, the processing coincides in part—one phase must start processing first, then the other can process. Two phases have an independent relationship when they are completely disjoint from one another.

In some embodiments, process oriented phase relationships may be denoted as Sequential: "SO (Py after Px)", overlapping: "OO (Py overlapping Px)", or independent: "IO (Py, Px)". A composite relationship called the Triggered relationship can be defined based on the fundamental data and process oriented relationships. Simply put, a triggered relationship is between any two phases Px and Py where processing in Py cannot occur before the processing in Px is complete, and data is not thrown directly between Px and Py. For the triggered relationship, Px is known as the triggering phase, and Py is known as the triggered phase, and is stated as: TO (Py on Px).

As discussed above, embodiments of name resolution process 10 may employ definitive resolution techniques. This means that resolution is only attempted when a definitive result can be achieved. Name resolution is not attempted when there is not enough data to yield a result.

Figure 3:
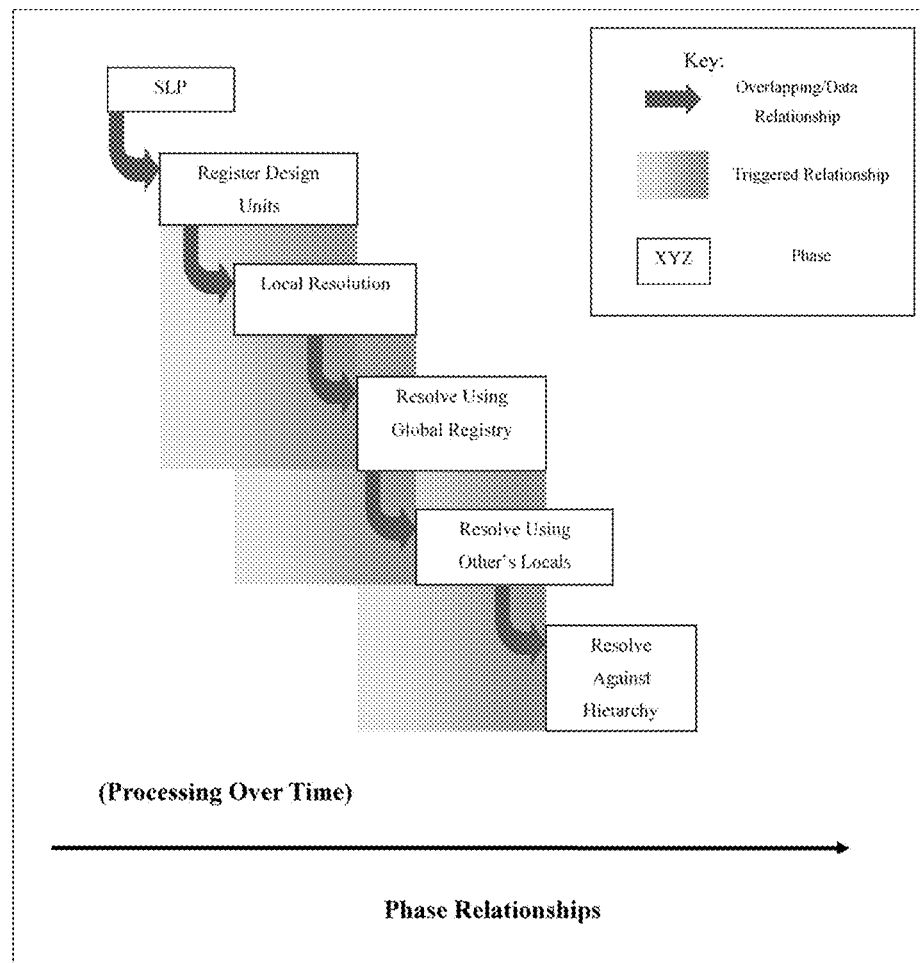
FIG. 3 is a diagram depicting phase relationships associated with the name resolution process in accordance with an embodiment of the present disclosure.

In some embodiments, and referring also to FIG. 3, name resolution process 10 may utilize a number of phases each of which is discussed in further detail hereinbelow. The phases may include P1: Source Language Processing (SLP), P2: Register Design Units, P3: Local Resolution, P4: Resolve using Global Registry, P5: Resolve Against other Design Units' Local Declarations, and P6: Resolve Against Hierarchy.

In some embodiments, name resolution process 10 may utilize a number of process oriented phase relationships each of which is discussed in further detail hereinbelow. The process oriented phase relationships may include OO (Register Design Units overlapping SLP), OO (Local Resolution overlapping Register Design Units), OO (Resolve Using Global Registry overlapping Local Resolution), OO (Resolve Using Others Locals overlapping Resolve Using Global Registry), OO (Resolve Against Hierarchy overlapping Resolve Using Others' Locals), TO (Resolve Using Global Registry on Register Design Units), TO (Resolve Using Others' Locals on Local Resolution), TO (Resolve Against Hierarchy on Resolve Using Global Registry)

In some embodiments, the data oriented phase relationships may include P1→P2, P2→P3, P3→P4, P4→P5, and P5→P6. The Source Language Processing phase (i.e., P1) may be responsible for performing pre-processing, lexical analysis, and syntactical analysis for the SystemVerilog source. It may create sub-tree entries in the AST. Each sub tree entry may represents a Design Unit. When the processing of each Design Unit is completed, a reference to the sub-tree may be sent to the next phase (P2—Register Design Units). Note that the processing of each Design Unit is independent, and can occur in parallel.

In some embodiments, the register design units phase (i.e., P2) may be configured to register each Design Unit into a registry database. Each Design Unit is known by its name. After registration, the reference to the AST sub-tree may be sent to the next phase (i.e., P3—Local Resolution). Again, note that Design Unit registration occurs in parallel.

In some embodiments, the Local Resolution phase begins the actual name resolution by posing the following question for each element reference within the Design Unit: "Does this element reference match an element definition found within the Design Unit?" Since this phase is performing resolution, it may be configured to read the AST sub-tree it has been given, and produce constructs in the RST. Non-reference elements (e.g., definitions, etc.) may be constructed in the RST. Reference elements may be either resolved locally, and RST constructs representing this are created, or they are not resolved locally and temporary RST constructs are created to represent this situation. It should be noted that in this phase the name resolution occurs within the Design Unit—name resolution does not venture outside of the Design Unit. Therefore, each Design Unit can be processed at the same time. It should also be noted that since the Design Unit is fully formed, the order restriction of "define before reference" is lifted. Once the local resolution processing is completed for a Design Unit, a reference to the RST sub-tree (representing the Design Unit) may be sent to the next phase (i.e., P4—Resolve Using Global Registry).

In some embodiments, the Resolve Using Global Registry phase has a triggered relationship on the P2 phase (i.e., Register Design Units). That is, resolution using the global registry cannot begin until all the Design Units are registered. In this phase references to references that were not resolved during P3 (i.e., Local Resolution) may be resolved using the registry created in P2. This effectively connects instances with declarations. This step may occur in parallel for each Design Unit. When this processing is complete for each Design Unit, a reference to the RST sub-tree (representing the Design Unit) is sent to the next phase (i.e., P5—Resolve Against other Design Units' Local Declarations).

In some embodiments, in the Resolve Against other Design Units' Local Declarations phase, items may be resolved by looking into other Design Units for their locally resolved items. All locally resolved items may be completed in P3—therefore this phase must wait until P3 is complete, hence a triggered relationship exists between P3 and P5. Note these are not hierarchical references (e.g. "a.b"). These are items such as parameter and port connections on instances, for example. When this processing is complete for each Design Unit, a reference to the RST sub-tree (representing the Design Unit) is sent to the next phase (P6—Resolve Against Hierarchy).

In some embodiments, the Resolve Against Hierarchy phase may be configured to resolve any remaining items in a Design Unit by using the full design hierarchy. These may be items such as "a.b.c.d". At this point, all Design Units are known, and individual instances within each Design Unit may be resolved using the global registry (Phase P4)—hence the triggered relationship between P4 and P6.

Accordingly, embodiments of name resolution process 10 are no longer constrained to the order of declarations found within the SystemVerilog source files. The ability to do out of order name resolution is of significant benefit. This is enabled by the split between data models that focus entirely on parsing (AST) and name resolution (RST), and further enables high speed parallel name resolution through the overlapping phase based system running thousands of tasks.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for performing out of order name resolution in an electronic design language comprising:
   receiving, one or more design units associated with an electronic design;
   registering the one or more design units in a registry database;
   performing local name resolution for each element reference within at least one of the one or more design units, wherein performing local name resolution is performed out of order as it is not constrained to an order of declarations;
   in response to registering, identifying at least one element reference upon which local name resolution was not performed and obtaining an appropriate element reference from the registry database;
   reviewing at least one secondary design unit for one or more local declarations; and
   performing local name resolution for one or more remaining element references using a design hierarchy.

2. The computer-implemented method of claim 1, further comprising:
   generating the one or more design units, wherein each of the one or more design units is configured as a sub-tree entry in an abstract syntax tree.

3. The computer-implemented method of claim 1, wherein the element reference is at least one of a package, a class, a class object, a module instance, a function, and a method.

4. The computer-implemented method of claim 1, further comprising:
   receiving incoming source code associated with the electronic design; and
   parsing the incoming source code to generate an abstract syntax tree ("AST").

5. The computer-implemented method of claim 4, wherein performing local name resolution for each element reference includes reading the abstract syntax tree.

6. The computer-implemented method of claim 5, further comprising:
producing at least one construct in a resolved syntax tree ("RST") based upon, at least in part, the reading of the abstract syntax tree.

7. The computer-implemented method of claim 6, wherein the at least one construct is one or more of a non-reference element and a reference element.

8. A non-transitory computer-readable storage medium, the computer-readable storage medium having stored thereon instructions that when executed by a machine result in the following operations for performing out of order name resolution in an electronic design language:
receiving, one or more design units associated with an electronic design;
registering the one or more design units in a registry database;
performing local name resolution for each element reference within at least one of the one or more design units, wherein performing local name resolution is performed out of order as it is not constrained to an order of declarations;
in response to registering, identifying at least one element reference upon which local name resolution was not performed and obtaining an appropriate element reference from the registry database;
reviewing at least one secondary design unit for one or more local declarations; and
performing local name resolution for one or more remaining element references using a design hierarchy.

9. The non-transitory computer-readable storage medium of claim 8, further comprising:
generating the one or more design units, wherein each of the one or more design units is configured as a sub-tree entry in an abstract syntax tree.

10. The non-transitory computer-readable storage medium of claim 8, wherein the element reference is at least one of a package, a class, a class object, a module instance, a function, and a method.

11. The non-transitory computer-readable storage medium of claim 8, further comprising:
receiving incoming source code associated with the electronic design; and
parsing the incoming source code to generate an abstract syntax tree ("AST").

12. The non-transitory computer-readable storage medium of claim 11, wherein performing local name resolution for each element reference includes reading the abstract syntax tree.

13. The non-transitory computer-readable storage medium of claim 12, further comprising:
producing at least one construct in a resolved syntax tree ("RST") based upon, at least in part, the reading of the abstract syntax tree.

14. The non-transitory computer-readable storage medium of claim 13, wherein the at least one construct is one or more of a non-reference element and a reference element.

15. A system for performing out of order name resolution in an electronic design language comprising:
a computing device having at least one processor configured to receive, one or more design units associated with an electronic design and to register the one or more design units in a registry database, the at least one processor further configured to perform local name resolution for each element reference within at least one of the one or more design units, wherein performing local name resolution is performed out of order as it is not constrained to an order of declarations, in response to registering, the at least one processor further configured to identify at least one element reference upon which local name resolution was not performed and obtaining an appropriate element reference from the registry database, the at least one processor further configured to review at least one secondary design unit for one or more local declarations and perform local name resolution for one or more remaining element references using a design hierarchy.

16. The system of claim 15, wherein the at least one processor is further configured to generate the one or more design units, wherein each of the one or more design units is configured as a sub-tree entry in an abstract syntax tree.

17. The system of claim 15, wherein the element reference is at least one of a package, a class, a class object, a module instance, a function, and a method.

18. The system of claim 15, wherein the at least one processor is further configured to: receive incoming source code associated with the electronic design; and
parse the incoming source code to generate an abstract syntax tree ("AST").

19. The system of claim 18, wherein performing local name resolution for each element reference includes reading the abstract syntax tree.

20. The system of claim 19, wherein the at least one processor is further configured to:
produce at least one construct in a resolved syntax tree ("RST") based upon, at least in part, the reading of the abstract syntax tree.

* * * * *